United States Patent [19]
Dimos et al.

[11] Patent Number: 5,950,292
[45] Date of Patent: Sep. 14, 1999

[54] METHODS OF FABRICATING APPLIQUE CIRCUITS

[75] Inventors: Duane B. Dimos; Terry J. Garino, both of Albuquerque, N.Mex.

[73] Assignee: Sandia Corporation, Albuquerque, N.Mex.

[21] Appl. No.: 08/811,305

[22] Filed: Mar. 4, 1997

[51] Int. Cl.[6] .................................................. H01G 4/06
[52] U.S. Cl. .......................... 29/25.42; 29/424; 216/13; 216/20; 427/79
[58] Field of Search ................................ 29/25.35, 25.42, 29/424, 423; 361/306.2, 321.4; 427/79–81; 216/13, 20

[56] References Cited

U.S. PATENT DOCUMENTS 5,228,184  7/1993  Kishi ........................................ 29/424 X
5,573,808  11/1996  Gruenwald et al. ................ 29/25.42 X

OTHER PUBLICATIONS

"Integrated Decoupling Capacitors using Pb(Zr,Ti)O$_3$ Thin Films" D. Dimos, S.J. Lockwood, T.J. Garino, H.N. Al-Shareef, and R.W. Schwartz, Materials Research Society Symposium Proceedings vol. 433, pp. 305–316 (1996).

*Primary Examiner*—Carl E. Hall

[57] ABSTRACT

Appliqué circuits suitable for advanced packaging applications are introduced. These structures are particularly suited for the simple integration of large amounts (many nanoFarads) of capacitance into conventional integrated circuit and multichip packaging technology. In operation, appliqué circuits are bonded to the integrated circuit or other appropriate structure at the point where the capacitance is required, thereby minimizing the effects of parasitic coupling. An immediate application is to problems of noise reduction and control in modern high-frequency circuitry.

12 Claims, 4 Drawing Sheets

METHODS OF FABRICATING APPLIQUE CIRCUITS

This invention was made with Government support under Contract DE-AC04-94DP85000 awarded by the U.S. Department of Energy. The Government has certain rights in the invention.

BACKGROUND

The present invention relates generally to the integration of external circuitry into microelectronic circuitry, and, more particularly, to the fabrication and integration of appliqué circuits into microelectronic circuitry, and most particularly, to the fabrication and integration of appliqué capacitors into microelectronic circuitry.

Electronic circuits have in recent years become increasingly fast. A difficulty associated with increasing operating frequencies, especially in digital or coupled analog-digital applications, is that extremely high circuit switching speeds make for increased difficulties with induced electrical noise. A common problem is high frequency switching noise induced in an operating circuit having a relatively lower frequency of operation. An example is noise spikes induced at the input of an amplifier, or in the power supply of such an amplifier. Clearly it is of benefit to exclude such noise spikes from the active regions of the circuitry.

One way to address this problem is to use decoupling capacitors (sometimes also termed bypass or balancing capacitors). Such application, which is well known in the art, utilizes the frequency-variable impedance of a capacitor to separate the noise pulses from the desired signal. In the above example, a properly designed decoupling capacitor will present a very high impedance to the relatively low frequency desired signal, whereas it will appear nearly as a dead short to the relatively high frequencies associated with short-duration noise spikes. If such a decoupling capacitor is connected across the input of the amplifier, the desired signal will be able to reach the input of the amplifier, whereas the noise spikes will appear to be shorted to ground, and will not enter. Similarly, spikes coming into the amplifier via the power supply can be selectively shorted to ground, while the desired power input is not affected.

The closer such a decoupling capacitor is to the load, the more effective it is in eliminating or reducing any high-frequency noise which might affect the desired operation of the circuitry. Ideally in an integrated circuit chip, such a decoupling capacitor would be fabricated on the active integrated circuit chip itself. Such a decoupling capacitor, however, is very difficult to manufacture using existing techniques, and is thus more commonly attached at the circuit board. This approach, although useful in many circumstances, does not allow the designer to properly optimize the high- and low-frequency behaviors of the decoupling circuitry, nor does it allow for maximization of the protective decoupling effect by placing decoupling capacitors close to the load.

Integration of decoupling capacitors on an integrated circuit chip, however, has many difficulties and drawbacks. Direct integration of suitable decoupling capacitors using conventional silicon-based integrated circuit fabrication technology, for example, is impractical. The capacitance desired is typically in the 10–100 nanoFarad (nF) regime, and operating voltages are typically 5 volts. Using materials commonly available in integrated circuit fabrication (e.g., silicon nitride for use as the dielectric material), the capacitance of a single-layer capacitor capable of withstanding the operating voltage is about 1 nF per $cm^2$. As multi-layer capacitors are quite difficult to fabricate using integrated circuit fabrication technology (especially those having many more than one active layer), it is clear that on the order of 100 $cm^2$ of chip area would have to be dedicated to fabrication of single-layer decoupling capacitors to protect the power and signal inputs of even a rather simple integrated circuit. Such a solution is quite impractical. Similarly, although thin-film capacitors using materials having high dielectric constants (such as ferroelectric perovskites) can be made, the conditions encountered during their fabrication are generally incompatible with conventional integrated circuit fabrication.

Other approaches exist, such as including discrete decoupling capacitors within the package of the integrated circuit, or attached in some manner to the surface of the integrated circuit itself, but prior attempts in such directions have met with systemic difficulties which seriously limit or prevent their application. These approaches have centered on trying to mount ceramic chip decoupling capacitors on or near an integrated circuit at some point during processing. At least two types of difficulties appear, that of size incompatibility and that of thermal/chemical incompatibility. A typical ceramic chip decoupling capacitor may have dimensions on the order of a millimeter on a side, whereas the typical height of features on the integrated circuit is a few microns. This vast difference in sizes causes incompatibility with many packaging and interconnection standards. Similarly, a typical ceramic chip decoupling capacitor will not withstand a hydrofluoric acid etching step, or processing at high temperature, or other stressful processing steps encountered in the fabrication of an integrated circuit. Such steps can sometimes be avoided, but at the cost of flexibility in circuit design.

A potential compromise is to integrate decoupling capacitors in a dense multichip packaging scheme, such as multichip modules, wherein several integrated circuits are combined in a single package for improved operation. Again, however, decoupling capacitors based on conventional integrated circuit fabrication are impractical, owing to the enormous amount of surface area required. As many multichip packages are fabricated from ceramics using fairly conventional thin- and thick-film technologies for fabrication of the required interconnects between chips, it might seem that ceramic chip decoupling capacitors would be appropriate here.

Ceramic chip decoupling capacitors can be used in some multichip packaging applications, but are non-optimal. The most obvious problem is again related to relative size. The height of a typical ceramic chip decoupling capacitor is incompatible with many approaches toward wiring and encapsulating multichip modules. Also, ceramic chip decoupling capacitors are quite limited in their ability to withstand rapid large changes in temperature, owing to their multilayer construction (often as many as 100 fragile ceramic layers are contained in a ceramic chip decoupling capacitor, with those layers attached to metal sheets having very different thermal expansion). Thus, integrating ceramic chip decoupling capacitors into a ceramic structure which then needs to be fired and cured is fraught with danger of low production yield.

For the above and many other reasons, prior art approaches toward application of decoupling capacitors can usefully be improved. Note that, although the above discussion focuses on the use of capacitors in the role of decoupling noise from desired signals, such capacitors can also be used for signal coupling, filtering, impedance matching. Any application in which being able to add capacitance at a desired location on an integrated circuit chip or in a multi-chip package will benefit from development of improved capacitors and mounting techniques. Note further that the techniques herein developed to add capacitance at a desired location on an integrated circuit chip may also usefully comprise other circuit elements, such as resistors, inductors, and even active components (e.g., a high-frequency power transistor).

The point of the above discussion is that today's increased range of functionality of microelectronic circuitry requires new and improved approaches toward the integration of nF-range capacitors into integrated circuit packaging and interconnect technology. The desire for robust circuitry, less sensitive to increasingly noisy internal and working environments, is driving a clear need for improved capacitors and mounting techniques which are compatible with conventional microelectronic fabrication techniques.

The present invention relates generally to a new class of circuitry, termed appliqué circuits, and methods of fabricating and mounting them which address and aid in solving many of the problems outlined above. To continue use of the example of decoupling capacitors, the basic design principle is to fabricate thin-film decoupling capacitors comprising a dielectric (e.g., a ferroelectric material) with a very high (typically on the order of 1000) dielectric constant on a substrate, attaching these decoupling capacitors to a mechanical grip, etching away the substrate, thereby forming an appliqué circuit comprising a thin-film decoupling capacitor. In use, the appliqué circuit is bonded in the desired position on, e.g., an integrated circuit, and then the mechanical grip is removed, leaving the thin-film capacitor mounted on the integrated circuit.

Our thin-film decoupling capacitors are typically a few microns in height, and can supply perhaps 1000 nanoFarads per square centimeter, so both thickness and surface area become freely compatible with integration on the integrated circuit itself, where such elements can function most effectively. Although our decoupling capacitors can be applied in the final stages of integrated circuit fabrication for most applications, they are sufficiently robust to withstand most integrated circuit fabrication steps, and so, if necessary, can be added at earlier points in the fabrication process. They are also very suitable for use in multichip packaging applications, being small in size and robust under most ceramic processing conditions. Various embodiments and other features, aspects, and advantages of the present invention will become better understood with reference to the following description and appended claims.

SUMMARY

We describe the fabrication and application of appliqué circuits, which combine a thin-film electronic circuit with a mechanical support for handling. The mechanical support is bonded to the thin-film electronic circuit using a bonding agent. The mechanical support can be released from the thin-film electronic circuit after the circuit is attached to, e.g., an integrated circuit chip, by dissolving the bonding agent. The thin-film circuit can include thin-film capacitors, resistors, inductors, and active electronic components. Appliqué circuits suitable for decoupling functions can be fabricated including thin-film decoupling capacitors with ferroelectric dielectrics.

BRIEF DESCRIPTION OF THE ILLUSTRATIONS

FIG. 1 shows a typical appliqué circuit with a thin-film capacitor suitable for decoupling applications.

FIG. 2 shows an appliqué circuit during several stages in the fabrication process. 2a) shows an etchable substrate with a thin-film circuit (here a capacitor) fabricated on its surface. 2b) shows the structure of 2a) with a mechanical support bonded to the etchable substrate and thin-film circuit with a bonding agent. 2c) shows the appliqué circuit ready for use after the etchable substrate is etched away.

FIG. 3 shows an appliqué circuit comprising a structural support layer. 3a) shows a structural support layer grown on the etchable substrate prior to fabrication of the thin-film circuit, the layer providing the appliqué circuit additional structural support. 3b) shows an intermediate stage in the fabrication of an appliqué circuit with a structural support layer allows thin-film components to be protected from the action of the substrate etchant.

FIG. 4 shows an appliqué circuit attached to a parent circuit by an adhesive layer after the bonding agent has been dissolved, the mechanical support removed, and the appliqué circuit has been electrically connected to the parent circuit.

DETAILED DESCRIPTION

The present invention comprises a novel method of fabrication and attachment of appliqué circuits to microelectronic circuitry.

Figure 1:
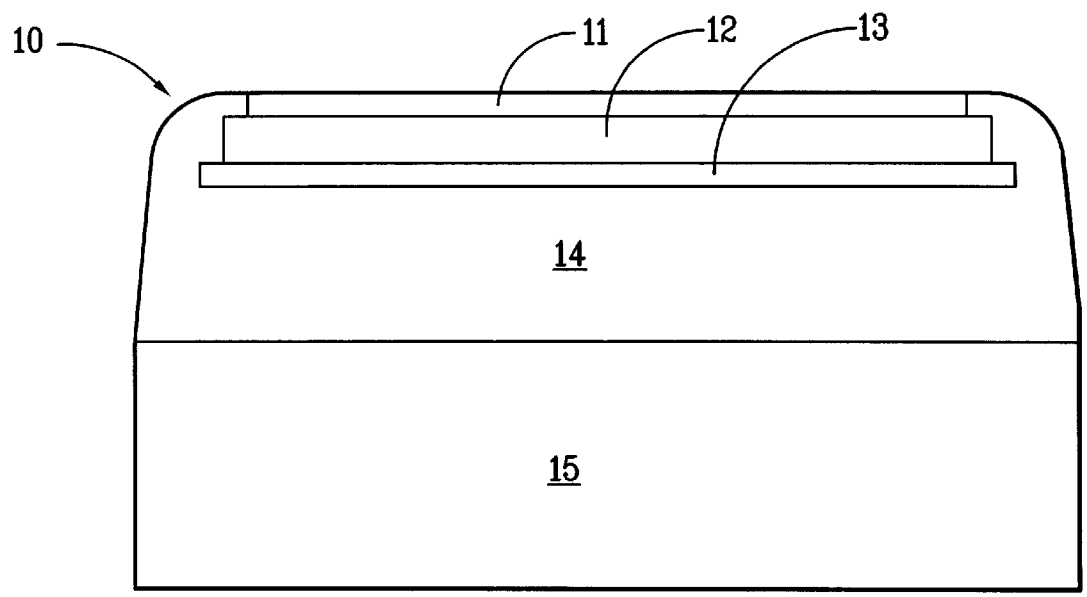

A schematic illustration of an appliqué circuit is depicted in FIG. 1. This cross-sectional view includes the primary features of the appliqué circuit. A thin-film circuit comprising a capacitor 10 is bonded to a mechanical support 15 by use of a bonding agent 14. (By thin-film circuit we explicitly include throughout this specification circuits fabricated using known thin-film and thick-film techniques. Circuits produced using these techniques, all well known in the art, are compatible with appliqué circuits.) The mechanical support can be a glass plate, and the bonding agent can consist of, e.g., a hydrocarbon wax. An appliqué circuit may be bonded to a substrate, have the mechanical support 15 dismounted by removing the bonding agent 14, whereupon the thin-film circuit 10 can be attached to other circuitry on the substrate by any of a number of metallization schemes that are well-known in the art.

In the present example, thin film capacitor 10 comprises a first conducting electrode 11, a second conducting electrode 13, and a dielectric material 12 sandwiched between these electrodes. The first and second conducting electrodes 11 and 13 can comprise any conducting material. In one implementation, the first conducting electrode 11 comprises a layer of Pt on top of a layer of Ti, and the second conducting electrode 13 comprises a layer consisting of Pt, Pd, or alloys thereof. In one implementation the dielectric material comprises a ferroelectric perovskite, preferably chosen from the group consisting of solid solutions of $PbZrO_3$ and $PbTiO_3$, with La or Nb added to improve the insulation resistance. More preferably the solid solution is chosen to comprise a solid solution having the composition $Pb_xLa_{1-x}Zr_yTi_{1-y}O_3$ such that $x>0.9$ and $0.3<y<0.7$. Alternately, another preferred solid solution has the composition $Pb_{1+x/2}Nb_xZr_yTi_{1-y}O_3$, such that $0.02<x<0.08$ and $0.3<y<0.7$. Note that thin-film capacitor 10 can be any thin-film circuit. We have chosen to use a capacitor as our example in view of the known applications of such a component in noise reduction by decoupling.

Figure 2A:
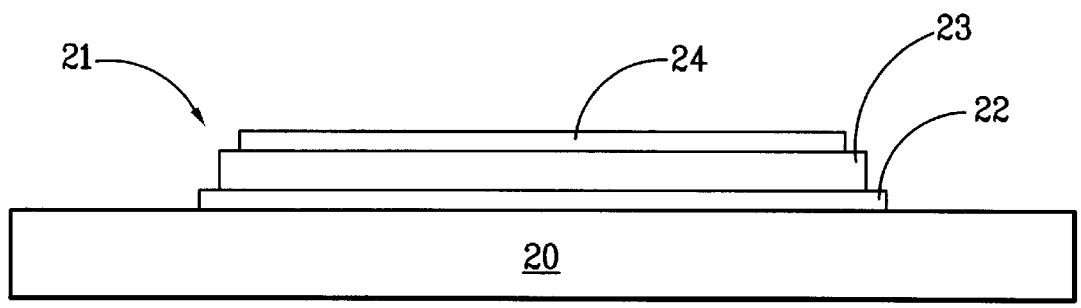

FIG. 2 shows various steps in the fabrication of an appliqué circuit. We again choose a thin-film capacitor as the active circuit element. FIG. 2a) shows an etchable substrate 20 with a thin-film capacitor 21 fabricated on one of its surfaces. Again, said fabrication can comprise any of a number of well-known techniques. The thin-film capacitor 21 comprises a first conducting electrode 22, a second conducting electrode 24, and a dielectric material 23 sandwiched between these electrodes. Elements 22, 23, and 24 can be defined lithographically so the final structure allows electrical access to the electrodes 22 and 24.

In one implementation, substrate 20 comprises a silicon wafer, electrode 22 comprises a layer of Pt over a layer of Ti, electrode 24 comprises a layer of Pt, Pd, or alloys thereof, and dielectric 23 is a ferroelectric perovskite, preferably chosen from the group of solid solutions of $PbZrO_3$ and $PbTiO_3$, with La and/or Nb added to improve the insulation resistance. A preferred composition for the solid solution is $Pb_xLa_{1-x}Zr_yTi_{1-y}O_3$ such that x>0.9 and 0.3 <y<0.7. An alternate preferred composition for the solid solution is $Pb_{1-x/2}Nb_xZr_yTi_{1-y}O_3$, such that 0.02<x<0.08 and 0.3<y<0.7. Dielectric 23 is typically between 0.2 and 2 microns in thickness.

Many techniques are known in the art for fabricating dielectric 23 from the perovskite-phase ferroelectric materials $PbZr_yTi_{1-y}O_3$ (also known as PZT), $Pb_xLa_{1-x}Zr_yTi_{1-y}O_3$ (also known as PLZT) or $Pb_{1-x/2}Nb_xZr_yTi_{1-y}O_3$ (also known as PNZT) in this thickness range. We have found the chemical solution deposition technique to be especially suited to the present application. As this technique is well known in the art, only a brief description of one specific implementation will be included here. This is not intended to limit the scope of the present invention.

One first reacts the appropriate ratio of zirconium butoxide-butanol and titanium isopropoxide to obtain a reactant having the ratio of Zr and Ti desired in dielectric 23. In the case of Nb-containing dielectrics, the stoichiometric amount of niobium ethoxide is added as part of this step. Acetic acid is then added, followed by methanol. Lead(IV) acetate and lanthanum (if desired) acetate or acetylacetonate are then added and the solution is heated to about 85° C. to dissolve these salts. The proportions of these salts is chosen so that the amount of lanthanum added is the stoichiometric amount desired in dielectric 23, whereas approximately 10 mol % excess lead acetate is added beyond the stoichiometric quantity to compensate for volatilization of PbO which occurs during an upcoming crystallization anneal. The solution is then diluted with methanol, acetic acid, and water to give a 0.4 M PLZT or PNZT precursor solution.

PLZT or PNZT films can be formed by, for example, spin coating the precursor solution onto a substrate 20. In one implementation, substrate 20 is a polished silicon wafers that has a Pt metallization, including a thin (typically 10–100 nm) adhesion layer (preferably Ti). After the precursor solution is placed on substrate 20, substrate 20 is spun at 3000 rpm for 30 seconds to remove excess precursor solution. Substrate 20 is then heated to about 300° C. for about 5 minutes to pyrolyze the organic species in the precursor film. The pyrolyzed precursor film is then crystallized (thereby forming the desired PLZT or PNZT dielectric material) by firing substrate 20 in air, typically at 650° C. for 30 minutes using a 50° C./minute heating and cooling ramp rate. This technique yields films that are single-phase perovskite and which have columnar microstructures, with a lateral grain size of 100–200 nm, both features of benefit for application as the dielectric in a thin-film capacitor. PLZT or PNZT layers made in this manner are typically about 100 nm in thickness after pyrolysis and crystallization, requiring multiple precursor solution layers to be deposited to obtain dielectric 23, which typically has a thickness of 0.2 to 2 microns. When this is done, a crystallization anneal is done after every few (preferably every four) spin-cast layers are deposited to avoid cracking of the film.

Use of thin-film capacitors to decouple very fast circuitry from even faster noise sources places demands on the metallization comprising electrodes 22 and 24 so that the intrinsic time constant of the capacitor is short enough to function properly in the desired application. The first and second conducting electrodes 22 and 24 must be approximately a micron or greater in thickness. However, the use of such thick electrodes is not straightforward, as they exhibit pronounced roughening and weaker adhesion to substrate 20, owing to thermal stresses which appear in thick metal films. Further difficulties appear when a PLZT, PNZT, or related dielectric layer is chosen for use. In particular, common electrode materials as Cu, Au, and Ag oxidize during the crystallization anneal and react chemically with PLZT or PNZT, thereby degrading performance significantly.

The problems presented in fabricating the first and second conducting electrodes 22 and 24 differ. Several techniques for fabrication of the first conducting electrode 22 have proven useful. First is the use of a Pt/Ti metallization scheme as described above. However, significant improvement can be made by sputter depositing the Pt/Ti metallization at about 300° C. rather than under ambient conditions. The elevated temperature deposition yields a metallization with reduced roughness and improved adhesion to the substrate, thereby giving improved capacitors with better production yield.

A further improvement can be obtained by substituting a $TiO_x$ or $ZrO_x$ adhesion layer for the Ti adhesion layer (still in combination with an elevated temperature Pt deposition). The $TiO_x$ or $ZrO_x$ layers are fabricated by sputtering Ti or Zr metal in an Ar atmosphere, and then annealing at 450° C. in flowing $O_2$. Note that the resulting films are not fully oxidized. This approach leads to good adhesion, smoother films, and increased tolerance of subsequent high-temperature processing.

An additional improvement in adhesion can be obtained by fabricating an adhesion layer by fully oxidizing thin (10–100 nm) Ti or Zr films at 750° C. in air, prior to depositing Pt at 300° C. Using these approaches, silicon substrates with 1 micron thick Pt first conducting electrodes have been fabricated that show good adhesion and lead to capacitor films with high yield.

The difficulty encountered in fabricating the second conductive electrode 24 is adhesion to the PLZT layer. Again, most common electrode materials (Al, Cu, Au, Ag) react with or show poor adhesion to the PLZT layer, leading to premature failure of thin-film capacitor 21. Further, typical adhesion promoters such as Ti, Cr, and Zr are not desirable, as they tend to form insulating oxides leading to premature component breakdown. Limited success has been obtained with nominally micron-thick Pt layers, but these are limited by the thermal stresses in the metal compounded by poor adhesion to the PLZT dielectric. Better results are seen with micron-thick Pd layers, which exhibit better adhesion to PLZT. An improved approach is to deposit a relatively thin (50–100 nm) layer of Pt or Pd on the PLZT surface, and cover this layer with a few hundred nanometers of a low resistance metal, such as Al, Cu, Au or Ag. Such a design for the second conducting electrode 24 optimizes adhesion while minimizing resistance and mechanical stress.

Figure 2B:
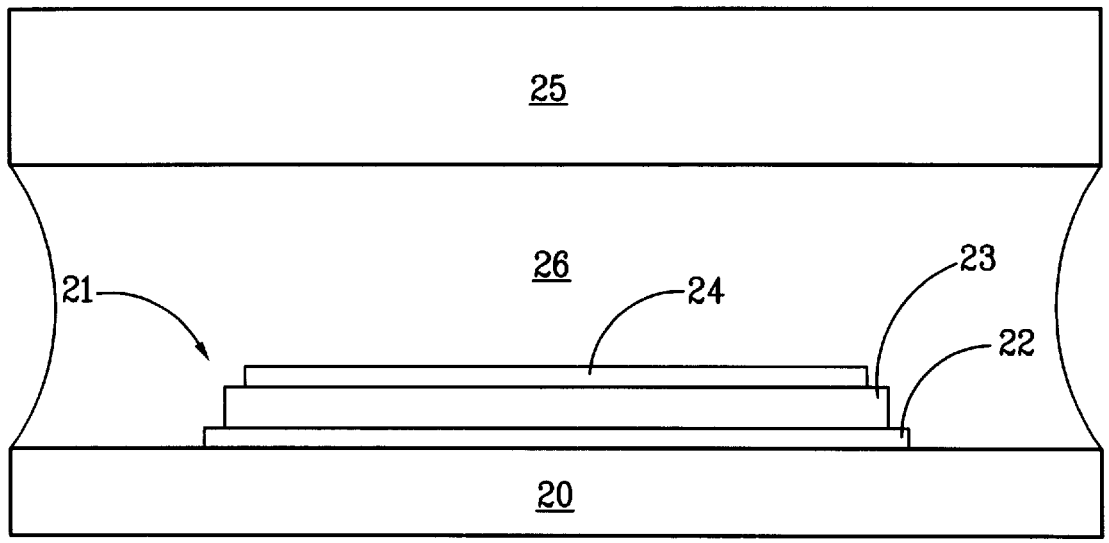

FIG. 2b) depicts an intermediate stage in the fabrication of an appliqué circuit, comprising a mechanical support 25 bonded to the substrate 20 and thin-film capacitor 21 by a bonding agent 26. In one implementation, mechanical support 25 is a glass plate, but it can take any form consistent with the process of fabricating the appliqué circuit. In one implementation, bonding agent 26 must not only attach mechanical support 25 to substrate 20, but must also seal thin-film capacitor 21 against the action of any etchants used in later steps to remove substrate 20, and must be capable of being dissolved by a solvent compatible with both the thin-film circuit and any circuitry or other functioning parts of a device to which the appliqué circuit is to be attached. Many organic materials, typically polymers and hydrocarbon waxes, satisfy these requirements. In one implementation, we have used octadecane, a saturated hydrocarbon. Although this material melts at 28° C., the surface tension of the very thin layer of bonding agent 26 is sufficient to securely bond mechanical support 25 to substrate 20 during processing.

Figure 2C:
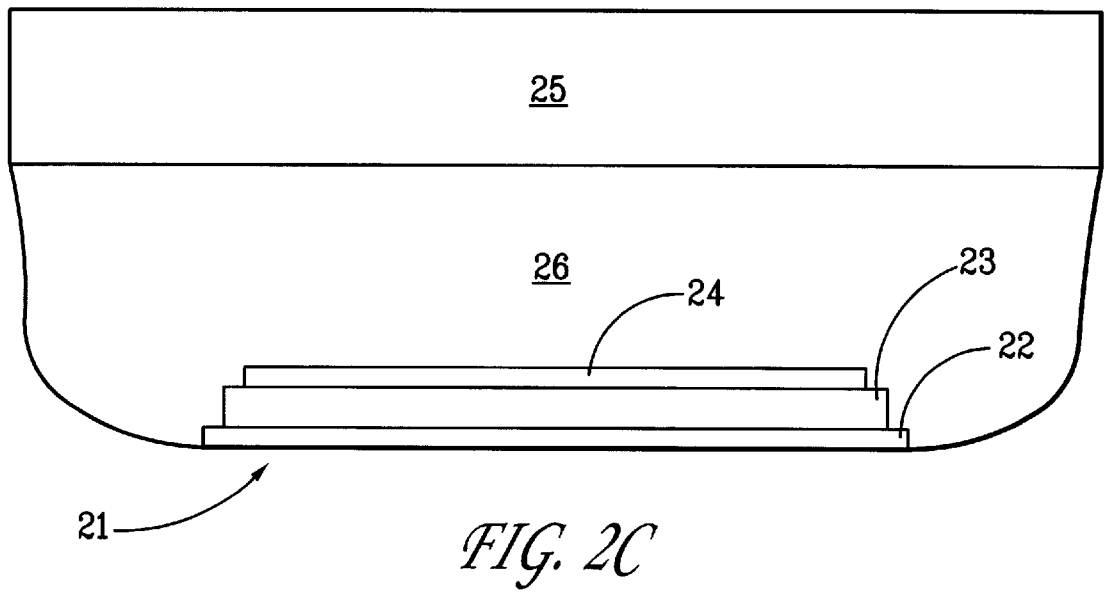

Following attachment of mechanical support 25, etchable substrate 20 is removed through application of sufficient quantities of an etchant which will substantially leave intact first conducting electrode 22, mechanical support 25, or bonding agent 26, leaving the finished appliqué circuit as depicted in FIG. 2c). In one implementation, suitable when substrate 20 is a polished silicon wafer, KOH is used as the etchant. The appliqué circuit is now ready to be attached to a parent circuit.

Figure 3A:
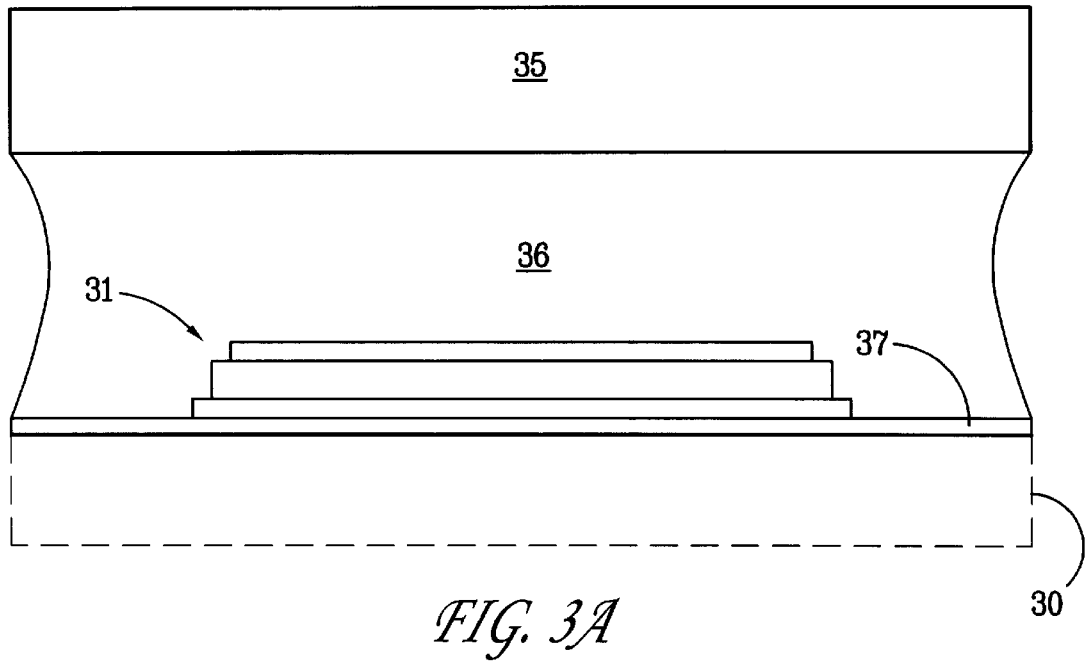

FIG. 3a) shows an additional implementation of an appliqué circuit, including a structural support layer 37. Layer 37 is fabricated on top of the etchable substrate 30 (shown etched away in the figure) prior to the fabrication of thin-film capacitor 31. Mechanical support 35 is attached to thin-film capacitor 31 and structural support layer 37 by bonding agent 36. In one implementation, substrate 30 is a silicon wafer possessing a sub-micron layer of silicon oxide (not shown) buried several microns below the surface. This layer will function as a KOH etch stop when the substrate 30 is removed, leaving behind a structural support layer 37 comprising a sub-micron silicon oxide layer and several microns of silicon. If desired, an HF etch can be used following the KOH etch to remove the silicon oxide layer, producing a silicon structural support layer 37.

Another implementation is to use as etchable substrate 30 a standard silicon wafer that has fabricated on the top surface a thermal oxide layer, followed by a layer of polycrystalline silicon several microns thick. A chemical vapor deposited silicon oxide layer may be placed on top of the polycrystalline silicon layer if desired. The thermal oxide serves as the KOH etch stop, and can be removed if desired by an HF etch, leaving behind a polycrystalline silicon structural support layer 37.

One potential hazard of the fabrication procedures described above is that the PLZT or PNZT dielectric material within thin-film capacitor 31 is extremely susceptible to damage from the KOH etch. We hereby disclose a method, depicted in FIG. 3b), by which the dielectric material does not have to be in place during the KOH etch, thereby avoiding this problem. Take a polished silicon etchable substrate 30, form a front surface layer 39a and a rear surface layer 39b of thermal silicon oxide (typically of sub-micron thickness), and fabricate a structural support layer 37 and an etch patterning layer 38 on opposite surfaces of the wafer. Layers 37 and 38 preferably comprise layers of silicon nitride no thicker than a few microns, more preferably less than a micron in thickness, and most preferably having a thickness between 150 and 500 nm. Layers 37 and 38 are preferably grown using high-temperature chemical vapor deposition techniques to minimize the residual stress in the layers. Silicon nitride is essentially impervious to the KOH etchant. Openings are created in the etch patterning layer and the rear thermal oxide surface layer 39b. These openings will typically be made using conventional photolithographic procedures, but in principle can also be made by grinding or through other mechanical removal of material. The wafer is then placed in a KOH etchant. The etchant will etch channels through the wafer by dissolving the silicon through the openings in the etch patterning layer. After a controlled time, the channels will penetrate through to the front thermal oxide surface layer 39b, where the thermal oxide will halt the action of the KOH etchant. Of the etchable substrate 30, only a thin web of silicon remains to provide a structural connection between the front oxide layer 39a and the rear oxide layer 39b remains.

Figure 3B:
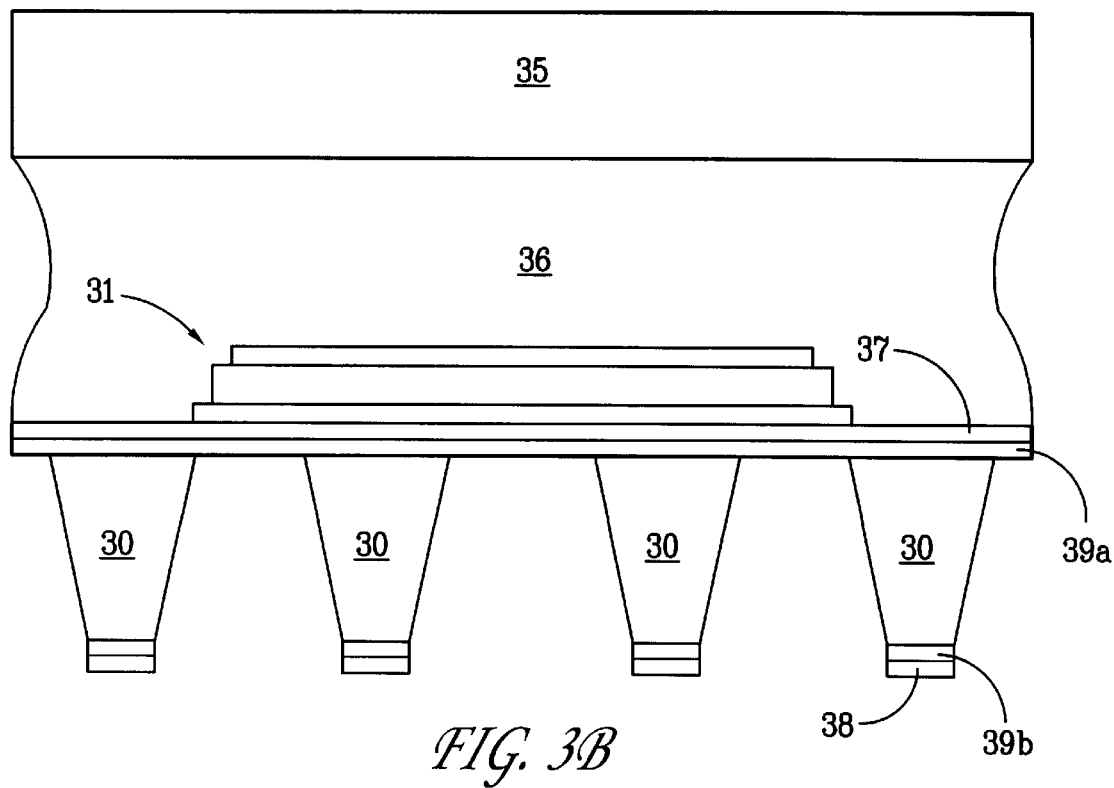

At this point, the structural support layer 37, reinforced by the front oxide layer 39a, the web of silicon 30 which connects layer 39a to layer 39b, and the etch patterning layer 38, is sufficiently strong to withstand the PLZT or PNZT growth process. The thin-film capacitor 31 is then fabricated on top of the structural support layer 37, and the mechanical support 35 is attached using a bonding agent 36. FIG. 3b) shows the appliqué circuit at this stage of fabrication. At this point, an HF etch is used to dissolve front thermal oxide surface layer 39a, whereupon the finished appliqué circuit comprising a structural support layer 37 is attained.

Adding appliqué circuits to integrated circuits, multichip packaging assemblies, conventional printed circuitry, and even inactive substrates will now be described. For convenience, we will refer to mounting an appliqué circuit to a parent circuit, even when the parent circuit does not electrically connect to the appliqué circuit. For example, an appliqué circuit may be designed to respond to an external radio frequency signal, which signal powers it to perform some function or to rebroadcast a response. Such an appliqué circuit will typically be mounted on an inert substrate (e.g., a purchase in a store, or as a tag on an animal). This will still be referred to as being mounted on a parent circuit, as the procedures are the same.

In mounting an appliqué circuit on a parent circuit, the appliqué circuit is positioned, typically by gripping or otherwise holding the mechanical support, over a desired point of attachment on the parent circuit. The appliqué circuit is then attached to the parent circuit at the desired point of attachment. Many methods of attachment can be used. An adhesive layer can be used, provided that the adhesive is compatible with the materials involved and the remaining processing steps that the parent circuit will undergo (if any). An attractive option under some circumstances involves the use of a conducting adhesive to attach the appliqué circuit. This can, for example, simplify connecting the first conducting electrode of an appliqué circuit which does not have a structural support layer to an exposed contact on top of a parent circuit. In appropriate circumstances, solder bumps, or other configurations of low-melting-point metallic alloys can serve to attach the appliqué circuit to the parent circuit.

Following attachment to the parent circuit, a suitable solvent can be used to remove the bonding agent. If the bonding agent is a hydrocarbon wax, a nonpolar organic solvent will typically be used to remove it, typically a short-chain saturated hydrocarbon that is liquid under ambient conditions, such as decane or octane. If a polymer is used as bonding agent, a solvent suitable to that bonding agent must be used. In any case, however, the solvent used must be compatible with the appliqué circuit, the parent circuit, and the method of attaching the appliqué circuit to the parent circuit.

Figure 4:
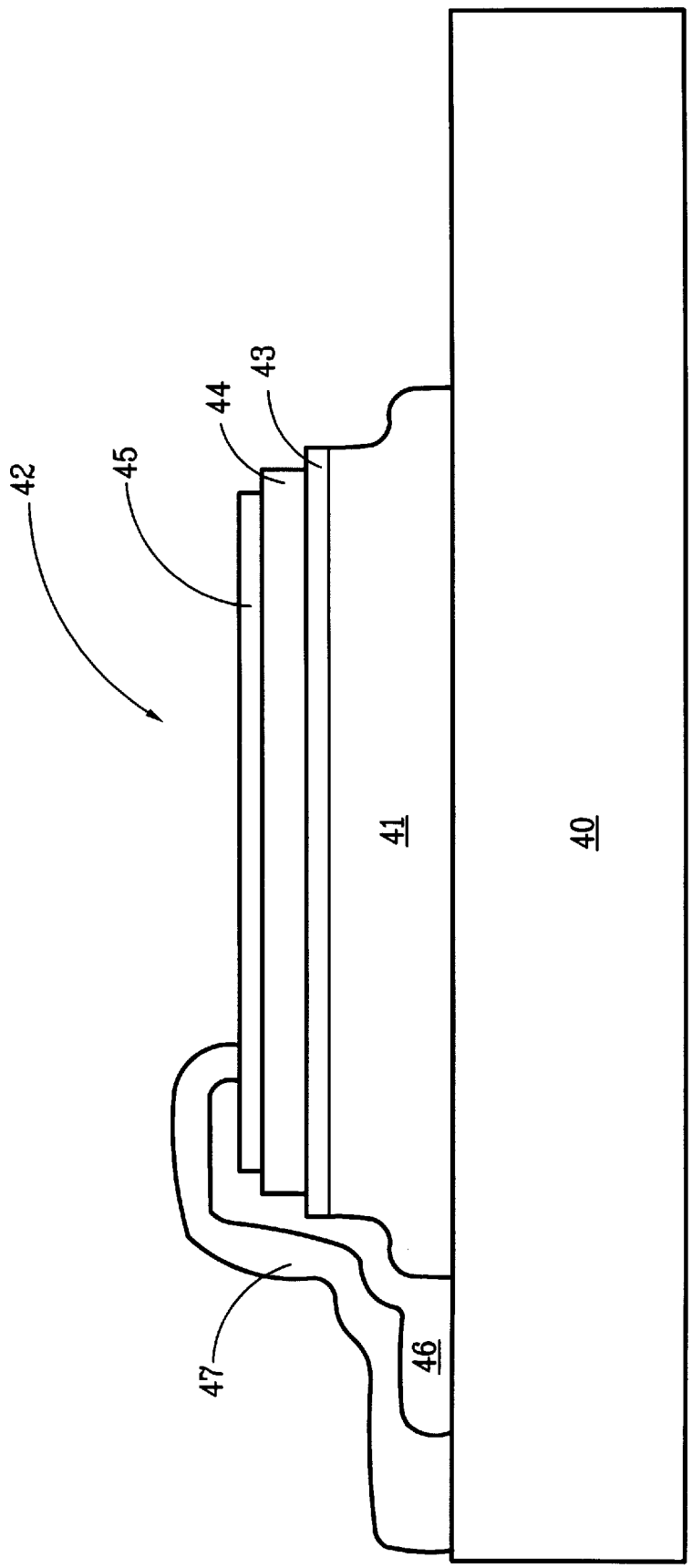

FIG. 4 shows an appliqué circuit attached to a parent circuit by an adhesive layer after the bonding agent has been dissolved, the mechanical support removed, and the appliqué circuit has been electrically connected to the parent circuit. The parent circuit 40 provides a base on which the remaining elements are affixed. An adhesive layer 41 is used to attach the appliqué circuit 42 (which now, in this example, following removal of the bonding agent and the mechanical support, includes a thin-film capacitor comprising a first conductive electrode 43, a second conductive electrode 45, and a dielectric material 44 sandwiched between these electrodes) to the parent circuit. Insulating layer 46 is used to allow contact to be made to second conductive electrode 45 without shorting it to first conducting electrode 43. A conducting layer 47 is then selectively deposited, using conventional lithographic or thick-film technologies, to provide electrical contact between the appliqué circuit and the parent circuit.

Other approaches toward making electrical connections between the appliqué circuit and the parent circuit will occur to one skilled in the art. One example is using thermocompression bonding to attach fine wires to specific locations on the appliqué circuit. Such procedures are subsumed into the general procedure of mounting an appliqué circuit on a parent circuit.

The present invention has a broad scope, with many variations being possible to one skilled in the art. The present invention is intended to be limited only by the claims appended hereto.

We claim:

1. A method for fabricating an applique circuit, comprising:
   i) forming a substrate comprising:
      a) a structural support layer, comprising an inner and outer surface;
      b) an adjoining etch patterning layer comprising an inner and outer surface; and
      c) a structural web of silicon supports disposed between the inner surfaces of the structural support layer and the etch patterning layer;
   ii) fabricating a thin-film circuit on the outer surface of the structural support layer of said substrate;
   iii) applying a layer of a bonding agent between the thin-film circuit and a mechanical support so that the thin-film circuit and the mechanical support are adjacently attached thereby, and;
   iv) separating the substrate from the thin-film circuit.

2. The method of claim 1, wherein the substrate is formed by steps comprising:
   i) making a polished silicon wafer having a front surface and a back surface;
   ii) growing a structural support layer on the front surface;
   iii) growing an etch patterning layer on the back surface;
   iv) opening a pattern of access holes through the etch patterning layer; and
   v) producing a structural web of silicon supports between the structural support layer and the etch patterning layer.

3. The method of claim 1, wherein the structural support layer comprises silicon nitride.

4. The method of claim 1, wherein the etch patterning layer comprises silicon nitride.

5. The method of claim 2, wherein producing the structural web of silicon supports comprises dissolving channels through the polished silicon wafer using a first etchant applied through the access holes in the etch patterning layer.

6. The method of claim 5, wherein the first etchant comprises potassium hydroxide.

7. The method of claim 5, further comprising using a second etchant to dissolve the structural web of silicon supports after the layer of bonding agent is applied between the thin-film circuit and the mechanical support.

8. The method of claim 7, wherein the second etchant comprises potassium hydroxide.

9. The method of claim 1, wherein the substrate further comprises a layer of thermally-grown silicon oxide between the inner surface of the structural support layer and the structural web of silicon supports.

10. The method of claim 9, further comprising using a third etchant to dissolve the layer of thermally-grown silicon oxide after the layer of bonding agent is applied between the thin-film circuit and the mechanical support.

11. The method of claim 10, wherein the third etchant comprises hydrofluoric acid.

12. The method of claim 2, further comprising thermally growing a layer of silicon oxide on the polished silicon wafer prior to growing thereon the structural support layer and the etch patterning layer.

* * * * *